United States Patent
Lee et al.

(10) Patent No.: US 7,566,667 B2
(45) Date of Patent: Jul. 28, 2009

(54) METHODS OF FABRICATING A SEMICONDUCTOR DEVICE HAVING A BARRIER METAL LAYER AND DEVICES FORMED THEREBY

(75) Inventors: Eung-Joon Lee, Gyeonggi-do (KR); Hyun-Young Kim, Seoul (KR); In-Sun Park, Gyeonggi-do (KR); Hyun-Deok Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 190 days.

(21) Appl. No.: 11/284,653

(22) Filed: Nov. 22, 2005

(65) Prior Publication Data

US 2006/0113615 A1   Jun. 1, 2006

(51) Int. Cl.
*H01L 21/31* (2006.01)
*H01L 21/469* (2006.01)

(52) U.S. Cl. .................. 438/762; 438/192; 438/216; 438/761; 257/E21.409

(58) Field of Classification Search .............. 438/197, 438/216, 761, 762; 257/E21.409
See application file for complete search history.

(56) References Cited

U.S. PATENT DOCUMENTS

| | | | |
|---|---|---|---|
| 5,242,860 A | | 9/1993 | Nulman et al. ............. 437/190 |
| 5,972,765 A | * | 10/1999 | Clark et al. ................. 438/308 |
| 6,025,281 A | * | 2/2000 | Passlack et al. ............. 438/779 |
| 6,087,206 A | * | 7/2000 | Hamada ....................... 438/162 |
| 6,436,819 B1 | | 8/2002 | Zhang et al. ................ 438/656 |
| 6,649,538 B1 | * | 11/2003 | Cheng et al. ................ 438/775 |
| 6,833,306 B2 | * | 12/2004 | Lyding et al. ............... 438/301 |
| 6,891,238 B2 | * | 5/2005 | Mitani et al. ............... 257/410 |
| 6,921,937 B2 | * | 7/2005 | Weimer ....................... 257/319 |
| 6,924,197 B2 | * | 8/2005 | Weimer ....................... 438/257 |
| 6,943,126 B1 | * | 9/2005 | Narayanan et al. .......... 438/784 |
| 7,087,507 B2 | * | 8/2006 | Koldiaev et al. ............ 438/528 |
| 7,101,812 B2 | * | 9/2006 | Eisele et al. ................ 438/769 |
| 7,132,371 B2 | * | 11/2006 | Parekh et al. ............... 438/763 |
| 2002/0031920 A1 | * | 3/2002 | Lyding et al. ............... 438/795 |
| 2003/0166316 A1 | * | 9/2003 | Nakamura ................... 438/197 |
| 2004/0266151 A1 | * | 12/2004 | Lim et al. .................... 438/585 |
| 2005/0151179 A1 | * | 7/2005 | Parekh et al. ............... 257/296 |
| 2005/0255684 A1 | * | 11/2005 | Koldiaev et al. ............ 438/528 |
| 2006/0003595 A1 | * | 1/2006 | Passlack et al. ............. 438/758 |
| 2006/0108606 A1 | * | 5/2006 | Saxler et al. ................ 257/200 |

* cited by examiner

*Primary Examiner*—George Fourson
*Assistant Examiner*—John M Parker
(74) *Attorney, Agent, or Firm*—Myers Bigel Sibley & Sajovec, P.A.

(57) ABSTRACT

A semiconductor device is formed by forming a gate region, including a gate oxide layer, and impurity diffusion regions on a semiconductor substrate, forming a barrier metal layer on the gate region and the impurity diffusion regions of the semiconductor substrate, forming a passivation layer at an interface between the semiconductor substrate and the gate oxide layer to remove defects of the gate oxide layer, and then performing a nitridation process to remove impurities from the semiconductor substrate.

30 Claims, 6 Drawing Sheets

METHODS OF FABRICATING A SEMICONDUCTOR DEVICE HAVING A BARRIER METAL LAYER AND DEVICES FORMED THEREBY

CROSS-REFERENCE TO RELATED APPLICATION

This application claims the benefit of Korean Patent Application No. 2004-0097836, filed Nov. 26, 2004, the disclosure of which is hereby incorporated herein by reference in its entirety.

BACKGROUND OF THE INVENTION

1. Technical Field

The present invention relates generally to methods of forming a semiconductor device and device structures formed thereby and, more particularly, to methods of fabricating semiconductor devices having a barrier metal layer and device structures formed thereby.

2. Discussion of Related Art

Generally, a semiconductor device is fabricated by forming various circuit structures through processes of depositing thin films to perform many functions and patterning them. The fabrication processes of a semiconductor device typically include a deposition process of forming layers on a semiconductor substrate; an etch process, such as photolithography, in which a photoresist layer is formed on the layers formed through the deposition process, the photoresist layer is exposed using a mask, and the layers are patterned using the patterned photoresist layer as an etch mask; a chemical mechanical polishing (CMP) process of depositing an interlayer insulating layer on the semiconductor substrate and polishing the top surface of the semiconductor substrate to remove a step height difference; and the like.

Recently, with a rapid development of telecommunication systems and a rapidly spreading popularity of data storage mediums, such as computers, semiconductor devices have also had significant developments. It may be desired that semiconductor devices be driven at a high speed, and have a large amount of storage capability. Therefore, the integration of semiconductor devices has gradually increased. With the increase of the integration of the semiconductor devices, the line width of a gate electrode and a contact size are also reduced, which may cause problems, such as increasing resistance of the active region and the gate region, and contact resistance. Therefore, recently in the fabrication of highly integrated semiconductor devices, a barrier metal is formed on the active region and the gate region to reduce resistances of the active region and the gate region and reduce a contact resistance so as to increase current driving capability.

FIG. 1 illustrates a conventional DRAM structure in which barrier metal is used in an active region and a gate region. Referring to FIG. 1, a p-type (or n-type) semiconductor substrate 10 is provided in which an active region and a field region are divided by a device isolation layer 12. A gate region 20, which comprises a gate oxide layer 14, a polysilicon layer 16, and sidewall spacers 18, is formed on the active region of the semiconductor substrate 10. N-type (or p-type) impurity diffusion regions 22 are formed in the active region, except for the gate region 20, and the impurity diffusion regions 22 function as source and drain regions.

A barrier metal 24, such as titanium (Ti), is formed on the gate region 20 and the impurity diffusion region 22, and an interlayer-insulating layer 26, which comprises an insulating material, such as boron phosphorus silicon glass (BPSG), is formed on the Ti layer 24. Conductive plugs for electrically connecting an upper interconnection (not shown) and the Ti layer 24, for example, tungsten plugs 28, are formed to penetrate the interlayer insulating layer 26 so as to be connected with the gate region 20 and the impurity diffusion region 22.

In a conventional method of forming the barrier metal, a Ti layer is formed using a plasma enhanced chemical vapor deposition (PECVD) by dissolving $TiCl_4$ gas using Ar and $H_2$ plasma energy, or a TiN layer is formed using $NH_3$ gas to secure a stable resistance. However, in a semiconductor device having a design rule of 80 nm or smaller, for example, a DRAM device, it may be difficult to ensure that capacitance characteristics are sufficiently secured and the fabrication process is stabilized with respect to a reliability of the gate oxide layer and the semiconductor device. Thus, to improve a reliability of the gate oxide layer, the fabrication may include a process of removing the defects caused in the gate oxide layer due to plasma damage incurred in a subsequent process.

FIG. 2 illustrates the process flow of a conventional method of forming barrier metal. Referring to FIG. 2, at block 100, titanium tetrachloride ($TiCl_4$) gas is bypassed to an exhaust line to stabilize the gas, and Ar and $H_2$ gas is supplied into a chamber having a wafer loaded therein through a gas injector part. At block 102, the $TiCl_4$ gas is pre-flowed so as to be diffused into the chamber, and, at block 104, plasma is generated using the Ar and $H_2$ gas supplied into the chamber. Using the Ar and $H_2$ plasma energy generated thereby, the $TiCl_4$ gas is dissolved to deposit Ti on the semiconductor substrate, thereby forming titanium silicide ($TiSi_2$) on the semiconductor substrate.

At block 106, the supply of the $TiCl_4$ gas is stopped after the silicide reaction. At block 108, a nitridation process is performed using $NH_3$ or $N_2/H_2$ plasma to remove Cl dissolved from the $TiCl_4$ gas during the formation process of the titanium silicide and existing in the semiconductor substrate. At block 110, the $NH_3$ or $N_2/H_2$ plasma remaining inside the chamber is removed.

As described above, because the $TiSi_2$ thin layer formed on the semiconductor substrate has a structure that is relatively stable at a high temperature, an ohmic contact is formed between silicon and metal so as to maintain stable resistance. The semiconductor substrate having the $TiSi_2$ thin layer is moved to another chamber for CVD TiN in-situ, and a CVD TiN thin layer is formed using thermal energy by the chemical reaction of $TiCl_4$ source gas and N2 gas, thereby forming a barrier metal, which comprises Ti/TiN. As such, because the barrier metal comprising Ti/TiN is formed over the active region, it may prevent a F attack from a WF6 gas during a subsequent tungsten plug formation process, thereby securing a stable contact resistance and stabilizing the characteristics of a semiconductor device.

In particular, a reliability of a gate oxide layer in a MOS transistor may have a great impact on the reliability of the entire semiconductor device. The reliability of the entire semiconductor device may be determined by the characteristics of the MOS transistor and the process conditions of backend processes of the whole fabrication of the semiconductor device. However, in the formation of the MOS transistor, the gate oxide layer may be depleted during the formation process until a contact process is performed as a backend process. As a result, leakage current characteristics may be degraded and the reliability of a MOS transistor be reduced, thereby reducing the reliability of the semiconductor device. The depletion of the gate oxide layer may be caused by defects of the silicon substrate or contamination or defects of the oxide layer, or may be caused by the dislocation of the silicon due to plasma damage or stress during a subsequent process, or contamination of the oxide layer due to contamination materials during a subsequent process.

In particular, plasma damage caused during a plasma process involved with PECVD Ti deposition may reduce the reliability of the gate oxide layer. Thus, a $H_2$ alloy process or $D_2$ deuterium annealing process may be performed after a metallization process has been performed in the conventional method to reduce the oxide layer failures caused by dislocation, such as mismatch of silicon crystals at the interface between the gate oxide layer and the silicon substrate. As a result of the $H_2$ alloy process or $D_2$ deuterium annealing process after the metallization process, silicon defects at the interface between the gate oxide layer and the silicon substrate can be somewhat removed by the passivation of $H_2$ or $D_2$, thereby providing an effect of increasing a reliability of the gate oxide layer. However, with the reduction of the design rule for semiconductor devices down to about 100 nm or smaller, because the area of an active region is reduced, and the area of a field region is also reduced in an STI structure, the stress applied to the silicon substrate is increased and the thickness of the gate oxide layer is reduced, thereby increasing the failures of the gate oxide layer. Particularly, because the reliability of the gate oxide layer may be significantly affected by a plasma process including PECVD Ti deposition or a metal contact etching and ashing process and the like, there is a limit to how much improvement in the reliability of the gate oxide layer may be achieved by the $H_2$ alloy process or $D_2$ deuterium annealing process performed after the metallization process.

SUMMARY OF THE INVENTION

According to some embodiments of the present invention, a semiconductor device is formed by forming a gate region, including a gate oxide layer, and impurity diffusion regions on a semiconductor substrate, forming a barrier metal layer on the gate region and the impurity diffusion regions of the semiconductor substrate, forming a passivation layer at an interface between the semiconductor substrate and the gate oxide layer to remove defects of the gate oxide layer, and then performing a nitridation process to remove impurities from the semiconductor substrate.

In other embodiments of the present invention, a semiconductor device is formed by forming a gate region, including a gate oxide layer, and impurity diffusion regions on a semiconductor substrate, forming a barrier metal layer on the gate region and the impurity diffusion regions of the semiconductor substrate, performing a nitridation process to remove impurities from the semiconductor substrate, and then forming a passivation layer at an interface between the semiconductor substrate and the gate oxide layer to remove defects of the gate oxide layer.

In further embodiments of the present invention, a semiconductor device includes a semiconductor substrate having a gate region and impurity diffusion regions formed thereon, the gate region includes a gate oxide layer. A barrier metal layer is disposed on the gate region and the impurity diffusion regions, the barrier metal layer including a silicide layer. A passivation layer is disposed at an interface between the gate oxide layer and the semiconductor substrate.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE INVENTION

Figure 1:
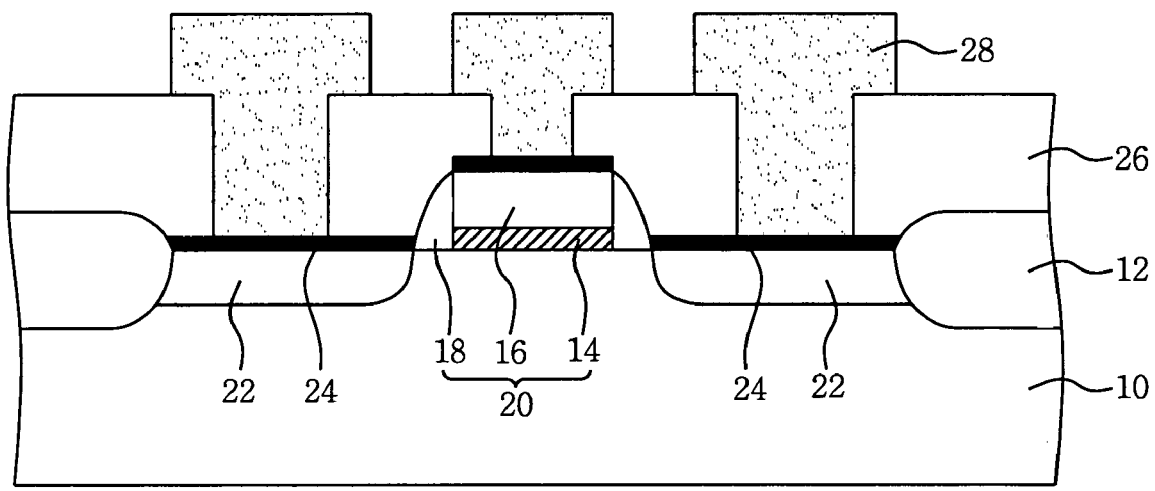
FIG. 1 is a sectional view of a conventional semiconductor device having a barrier metal layer formed thereon.
Figure 2:
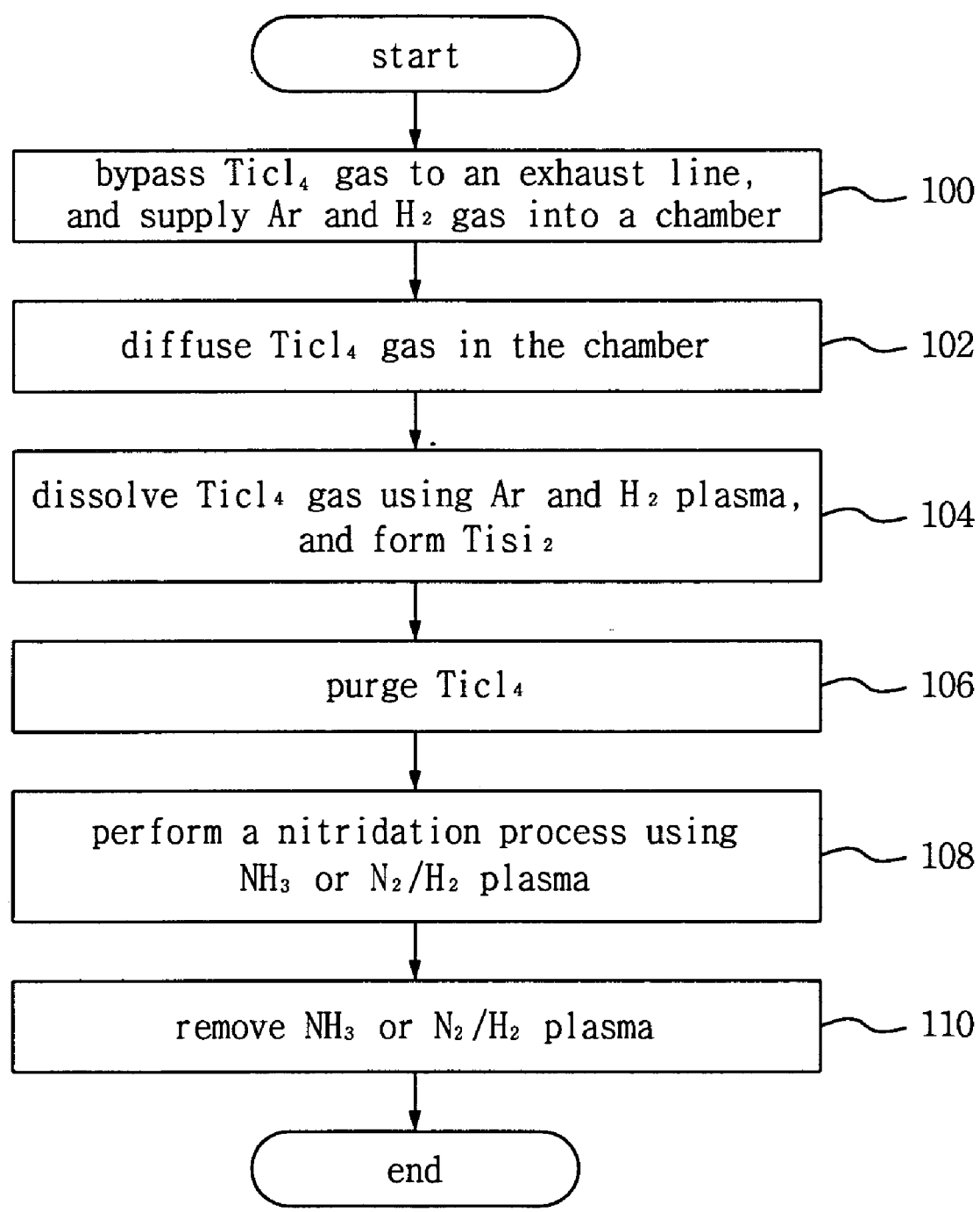
FIG. 2 is a flowchart that illustrates a conventional method of forming a barrier metal layer.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures were turned over, elements described as being on the "lower" side of other elements would then be oriented on "upper" sides of the other elements. The exemplary term "lower," can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
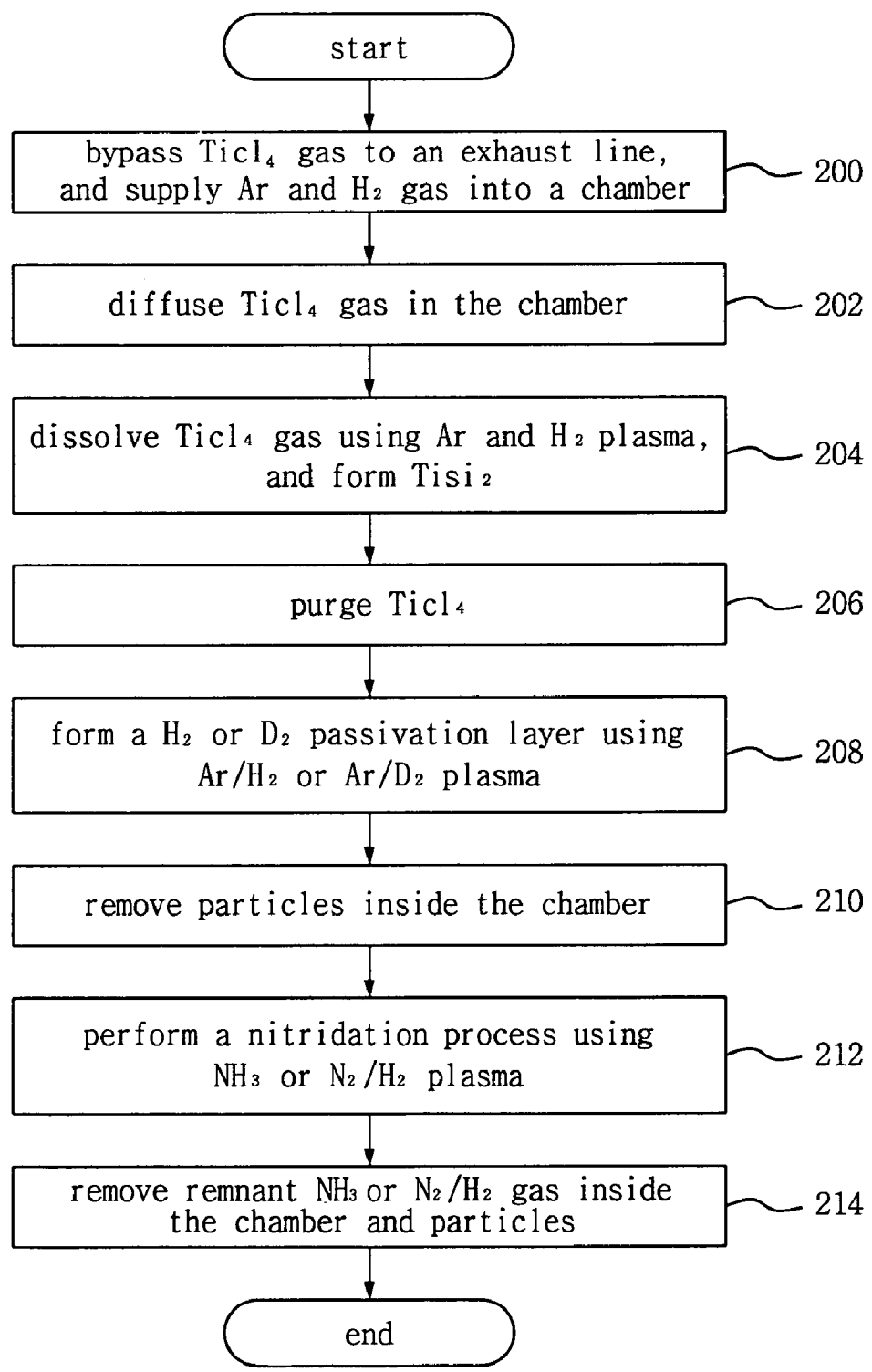
FIG. 3 is a flowchart that illustrates methods of forming a semiconductor device according to some embodiments of the present invention.
Figure 4A:
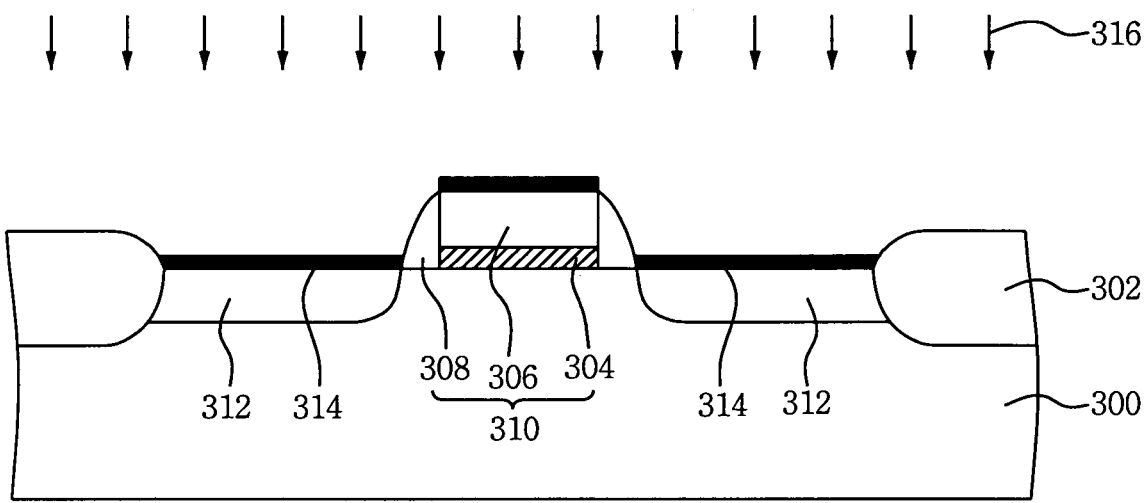
FIGS. 4A and 4B are sectional views of a semiconductor device formed in accordance with the process of FIG. 3 in accordance with some embodiments of the present invention.
Figure 4B:
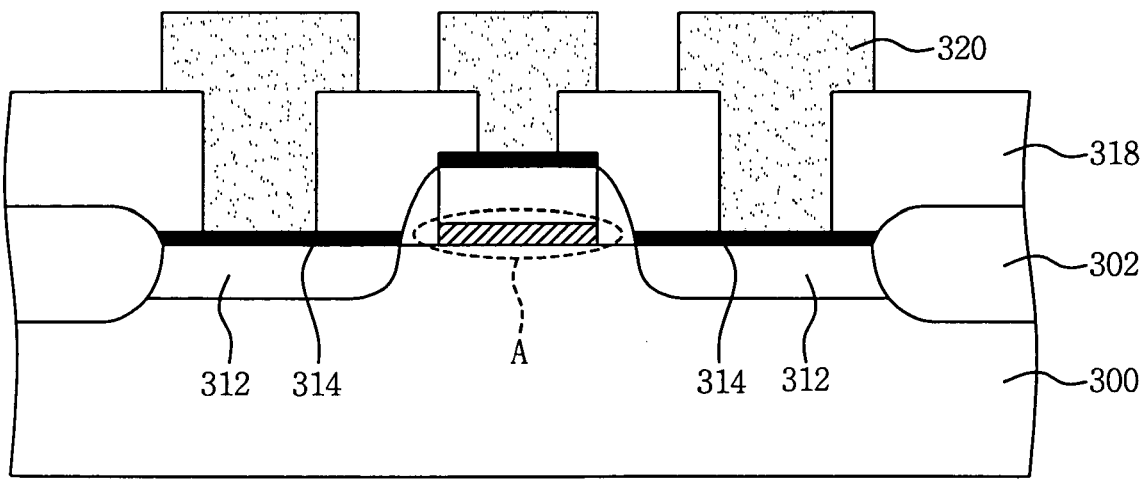

FIG. 3 illustrates the process flow of methods of fabricating a semiconductor device according to some embodiments of the present invention, and FIGS. 4A and 4B are sectional views of a semiconductor device fabricated in accordance with the process flow of FIG. 3.

First, referring to FIG. 4A, a device isolation layer 302 is formed in a p-type (or n-type) semiconductor substrate 300 to define an active region where a cell transistor is formed, and a field region for electrically insulating the cell transistor. The semiconductor substrate 300 may comprise silicon (Si), germanium (Ge), or gallium arsenide (GaAs) in accordance with various embodiments of the present invention. A gate region 310 is formed on the active region in the semiconductor substrate 300, which includes a gate oxide layer 304, a polysilicon layer 306, and sidewall spacers 308. N-type impurity (or p-type) ions are implanted into the active region except the gate region 310, thereby forming impurity diffusion regions 312 functioning as a source and a drain. Titanium silicide layers 314 are formed on the gate region 310 and the impurity diffusion regions 312, respectively, using Ar and $H_2$ plasma energy, and the titanium silicide layer 314 functions as barrier metal. The silicide layer may comprise titanium (Ti), molybdenum (Mo), tungsten (W), cobalt (Co), nickel (Ni) and the like in accordance with various embodiments of the present invention. A process of forming the titanium silicide layer 314 is described by way of example below.

In block 200 of FIG. 3, titanium tetrachloride ($TiCl_4$) gas is bypassed to an exhaust line through a mass flow controller (MFC) to stabilize the process gas, and Ar and $H_2$ gas is supplied into a chamber having a wafer loaded therein through a gas injector part. In block 202, the $TiCl_4$ gas is pre-flowed so as to be diffused into the chamber, and in block 204, plasma is generated using the Ar and $H_2$ gas supplied into the chamber. Using the Ar and $H_2$ plasma energy generated thereby, the $TiCl_4$ gas is dissolved, thereby forming $TiSi_2$ on the semiconductor substrate. In block 206, the deposition of the $TiSi_2$ by a predetermined thickness is completed, the supply of the $TiCl_4$ gas is stopped.

In block 208, defects of the gate oxide layer may be removed due to the plasma energy generated during formation of the titanium silicide layer 314 on the semiconductor substrate 300 through a PECVD process. A plasma process (316 of FIG. 4A) is performed on the semiconductor substrate 300 having the titanium silicide layer 314 formed thereon, using a mixing gas including $Ar/H_2$ or $Ar/D_2$. As a result, a $H_2$ or $D_2$ passivation layer is formed at the interface between the semiconductor substrate 300 and the gate oxide layer 304. Thus, titanium is deposited on the semiconductor substrate 300 using a PECVD process so that the defects of the gate oxide layer 304 generated during the process of forming the silicide layer are removed, thereby improving a reliability of the gate oxide layer 304.

Then, in block 210, particles, such as plasma residues or the like, existing inside the chamber are removed. In block 212, a nitridation process using $NH_3$ or $N_2/H_2$ plasma is performed to remove the Cl existing in the semiconductor substrate, which are dissolved from $TiCl_4$ during the process of forming the titanium silicide layer. In block 214, the $NH_3$ or $N_2/H_2$ remnant gas and particles, such as plasma or the like, remaining inside the chamber are removed.

Referring to FIG. 4B, an interlayer insulating layer 318, such as BPSG, is formed on the resultant structure having the $H_2$ or $D_2$ passivation layer on the interface A between the semiconductor substrate 300 and the gate oxide layer 304. A photolithography process is performed on the interlayer insulating layer 318, thereby forming contact holes exposing the surfaces of the gate region and the impurity diffusion region. A conductive layer is formed on top of the semiconductor substrate 300 having the contact holes, and, by patterning, contact plugs 320 are formed to electrically connect the gate region 310 and the impurity diffusion region 312 to an interconnection layer (not shown) to be formed through a subsequent process. The contact plug may comprise tungsten in some embodiments.

A barrier metal formation process, according to some embodiments of the present invention, includes supplying $TiCl_4$, Ar, and $H_2$ gas into a chamber having a wafer loaded therein through a gas inject part, thereby forming a titanium silicide layer functioning as barrier metal on the gate region and the impurity diffusion region; stopping the supply of the $TiCl_4$ gas after the titanium silicide layer is formed to a predetermined thickness; performing a plasma process using a mixing gas including $Ar/H_2$ or $Ar/D_2$. on top of the semiconductor substrate having the titanium silicide layer formed thereon, thereby forming a $H_2$ or $D_2$ passivation layer on the interface between the semiconductor substrate and the gate oxide layer to secure a stable contact resistance by removing the defects of the gate oxide layer damaged during the titanium silicide layer formation process on the gate region and the impurity diffusion region; and performing a nitridation process using $NH_3$ or $N_2/H_2$ plasma to remove the Cl dissolved from the $TiCl_4$ during the titanium silicide formation process and existing in the semiconductor substrate.

In the supplying operation, the $TiCl_4$ gas may be supplied into the chamber in various ways, e.g., bypassed to an exhaust line through an MFC to stabilize, and pre-flowed so as to be diffused into the chamber.

In accordance with some embodiments of the present invention described above, a titanium silicide layer as barrier metal is formed on the gate region and the impurity diffusion region, and then a passivation process is performed using $H_2$ or $D_2$ plasma. As a result, a problem that may be caused during the titanium silicide layer formation process, i.e., defects of the gate oxide layer due to dislocation, such as mismatch or the like at the interface between the semiconductor substrate and the gate oxide layer, may be removed, thereby providing an effect of improving the reliability of the gate oxide layer.

Figure 5:
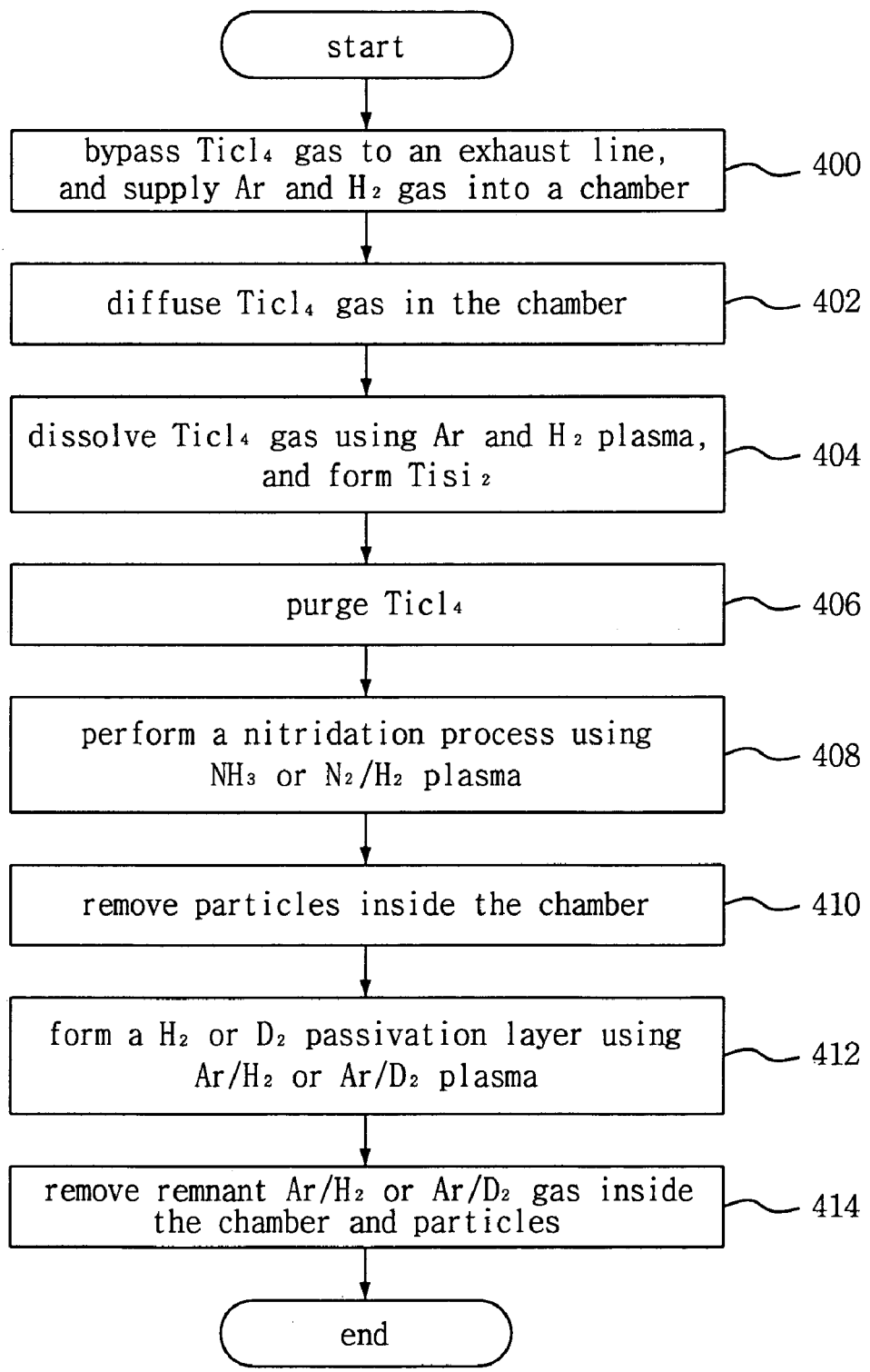
FIG. 5 is a flowchart that illustrates methods of forming a semiconductor device according to further embodiments of the present invention.
Figure 6A:
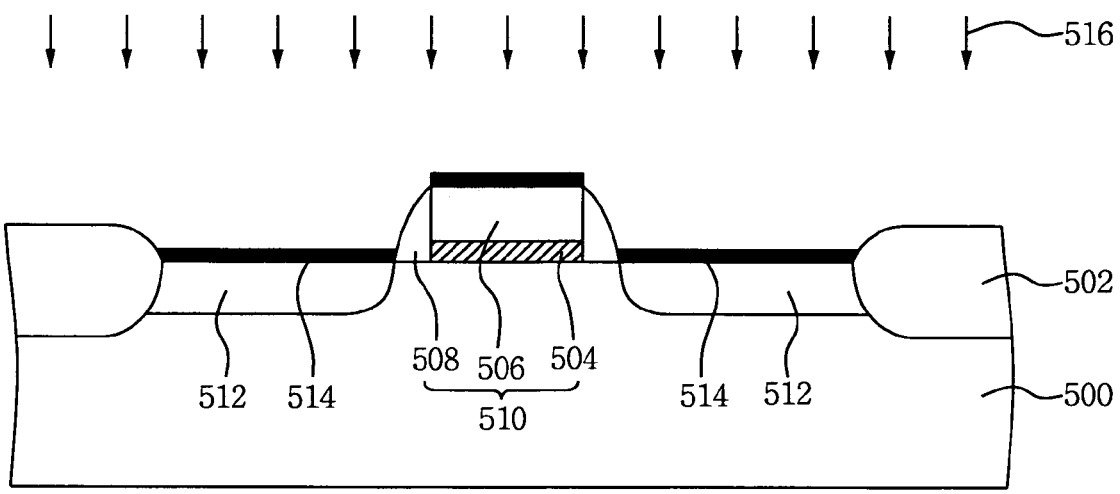
FIGS. 6A and 6B are sectional views of a semiconductor device formed in accordance with the process of FIG. 5 in accordance with some embodiments of the present invention.
Figure 6B:
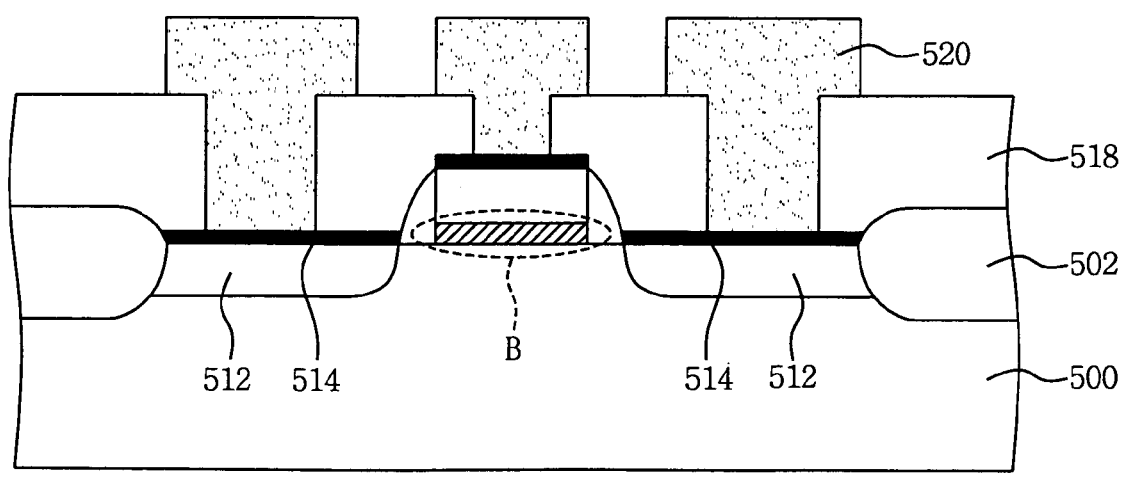

FIG. 5 illustrates the process flow of methods of fabricating a semiconductor device according to further embodiments of the present invention, and FIGS. 6A and 6B are sectional views of a semiconductor device fabricated in accordance with the process flow of FIG. 5.

Referring to FIG. 6A, a device isolation layer 502 is formed in a p-type (or n-type) semiconductor substrate 500 to define an active region where a cell transistor is formed and a field region for electrically insulating the cell transistor. The semiconductor substrate 500 may comprise silicon (Si), germanium (Ge), and/or gallium arsenide (GaAs) in accordance with various embodiments of the present invention. A gate region 510 is formed on the active region of the semiconductor substrate 500, which includes a gate oxide layer 504, a polysilicon layer 506, and sidewall spacers 508. N-type impurity (or p-type) ions are implanted into the active region except the gate region 510, thereby forming impurity diffusion regions 512 functioning as a source and a drain. Titanium silicide layers 514 are formed on the gate region 510 and the impurity diffusion regions 512, respectively, using Ar and $H_2$ plasma energy, and the titanium silicide layer 514 functions as a barrier metal. The silicide layer may comprise titanium (Ti), molybdenum (Mo), tungsten (W), cobalt (Co), nickel (Ni) and the like in accordance with various embodiments of the present invention. A process of forming the titanium silicide layer 514 is described by way of example below.

In block 400 of FIG. 5, titanium tetrachloride ($TiCl_4$) gas is bypassed to an exhaust line through an MFC to stabilize the process gas, and Ar and $H_2$ gas is supplied into a chamber having a wafer loaded therein through a gas injector part. In block 402, the $TiCl_4$ gas is pre-flowed so as to be diffused into the chamber, and in block 404, plasma is generated using the Ar and $H_2$ gas supplied into the chamber. Using the Ar and $H_2$ plasma energy generated thereby, the $TiCl_4$ gas is dissolved, thereby forming $TiSi_2$ on the semiconductor substrate. In block 406, the deposition of the $TiSi_2$ to a predetermined thickness is completed and the supply of the $TiCl_4$ gas is stopped.

In block 408, a nitridation process is performed using $NH_3$ or $N_2/H_2$ plasma to remove the Cl dissolved from $TiCl_4$ and existing in the semiconductor substrate during formation of the titanium silicide layer. Further, in block 410, particles, such as plasma residues or the like existing inside the chamber, are removed.

The operation of block 412 may improve the reliability of the gate oxide layer 504, which is in contact with the semiconductor substrate 500, in which a plasma process (516 of FIG. 6A) is performed on the semiconductor substrate 500 having the titanium silicide layer 514 formed thereon, using a mixing gas including $Ar/H_2$ or $Ar/D_2$. As a result, a $H_2$ or $D_2$ passivation layer is formed at the interface between the semiconductor substrate 500 and the gate oxide layer 504. Thus, the defects of the gate oxide layer 504, which may be caused by the plasma generated during the PECVD process of forming the titanium silicide layer functioning as barrier metal, may be removed, thereby improving the reliability of the gate oxide layer 504. In block 414, the $Ar/H_2$ or $Ar/D_2$ gas remaining inside the chamber and the particles, such as plasma residues, are removed.

Referring to FIG. 6B, an interlayer-insulating layer 518, such as BPSG, is formed on the resultant structure having the $H_2$ or $D_2$ passivation layer on the interface B between the semiconductor substrate 500 and the gate oxide layer 504. A photolithography process is performed on the interlayer insulating layer 518, thereby forming contact holes exposing the surfaces of the gate region 510 and the impurity diffusion region 512. Then, a conductive layer is formed on top of the semiconductor substrate 500 having the contact holes, and, by patterning, contact plugs 520 are formed to electrically connect the gate region 510 and the impurity diffusion region 512 to an interconnection layer (not shown) to be formed through a subsequent process. The contact plug may comprise tungsten in some embodiments.

A barrier metal formation process, according to further embodiments of the present invention, includes supplying $TiCl_4$, Ar, and $H_2$ gas into a chamber having a wafer loaded therein through a gas inject part, thereby forming a titanium silicide layer functioning as barrier metal on the gate region and the impurity diffusion region; stopping the supply of the $TiCl_4$ gas into the chamber after the titanium silicide layer is formed to a predetermined thickness; performing a nitridation process using $NH_3$ or $N_2/H_2$ plasma to remove the Cl dissolved from the $TiCl_4$ during the titanium silicide formation process and existing in the semiconductor substrate; and performing a plasma process using a mixing gas including $Ar/H_2$ or $Ar/D_2$ on top of the semiconductor substrate having the titanium silicide layer formed thereon to secure a stable contact resistance by removing the defects of the gate oxide layer damaged during the titanium silicide layer formation process on the gate region and the impurity diffusion region, thereby forming a $H_2$ or $D_2$ passivation layer on the interface between the semiconductor substrate and the gate oxide layer.

In the supplying operation, the $TiCl_4$ gas may be supplied into the chamber in various ways, e.g., bypassed to an exhaust line through an MFC to stabilize, and pre-flowed so as to be diffused into the chamber.

In the further embodiments of the present invention described above, a titanium silicide layer as a barrier metal is formed on top of the semiconductor substrate, and then, after a nitridation process is performed to remove the Cl dissolved from the $TiCl_4$ during the titanium silicide formation process and existing in the semiconductor substrate, a passivation process is performed using $H_2$ or $D_2$ plasma. As a result, a problem that may be caused during the PECVD process of forming the titanium silicide layer, i.e., defects of the gate oxide layer due to dislocation, such as mismatch of silicon crystals or the like at the interface between the semiconductor substrate and the gate oxide layer, may be removed, thereby providing an effect of improving the reliability of the gate oxide layer.

As described above, a barrier metal layer is formed to secure a stable resistance in the formation of contact plugs connected to the gate region or the impurity diffusion region. However, when the design rule of a semiconductor device is reduced to 100 nm or smaller, many problems may occur that are related to capacitance characteristics and the reliability of the device may deteriorate due to reliability problems with the gate oxide layer. In conventional technology, a $H_2$ alloy process or $D_2$ annealing process may be performed after a subsequent metallization process to suppress the failures of the gate oxide layer due to dislocation, such as mismatch of silicon crystals or the like at the interface between the semiconductor substrate and the gate oxide layer. The $H_2$ alloy process or $D_2$ annealing process performed after a subsequent metallization process may provide an effect of improving a reliability of the gate oxide layer to an extent, but when the design rule of a semiconductor device is reduced to 100 nm or smaller, the area of the active region is reduced, and the area of the field region in an STI structure is reduced, which may increase stress applied to silicon. Further, because the thickness of the gate oxide layer is reduced, the reliability of the gate oxide layer may still deteriorate. Particularly, a plasma process involved with PECVD Ti deposition or a metal contact etching and ashing process and the like may require more delicate care, and limitations of a $H_2$ alloy process or $D_2$ annealing process after a metallization process may still remain.

However, according to some embodiments of the present invention, before a subsequent metallization process, a nitridation process is performed to remove the residues caused after the titanium silicide layer functioning as barrier metal is formed, or in the state that the barrier metal is formed or during the process of forming the barrier metal, and then, a passivation process using $H_2$ or $D_2$ plasma is performed. As a result, a hydrogen or deuterium passivation layer is formed at the interface between the semiconductor substrate and the gate oxide layer. Therefore, deterioration of the gate oxide layer may be suppressed by the passivation layer even when the semiconductor device has a design rule of 100 nm or less, thereby improving a reliability of the semiconductor device.

As described above, according to some embodiments of the present invention, barrier metal is formed on the gate region or the impurity diffusion region to secure a stable resistance of contact plugs connected to the gate region or the impurity diffusion region, and then, a passivation process using $H_2$ or $D_2$ plasma is performed in the state that the barrier metal is formed, or the nitridation process is performed. As a result, because a $H_2$ or $D_2$ passivation layer is formed at the interface between the semiconductor substrate and the gate oxide layer, the deterioration of the gate oxide layer may be suppressed and a reliability of the gate oxide layer may be improved in a highly integrated semiconductor device having a design rule of 100 nm or less, thereby improving the reliability and the productivity of the semiconductor device.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A method of forming a semiconductor device, comprising:
    forming a gate region, comprising a gate oxide layer, and impurity diffusion regions on a semiconductor substrate;
    forming a barrier metal layer on the gate region and the impurity diffusion regions of the semiconductor substrate;
    forming a passivation layer at an interface between the semiconductor substrate and the gate oxide layer to remove defects of the gate oxide layer; then
    performing a nitridation process to remove impurities from the semiconductor substrate;
    forming an interlayer insulating layer on the resultant structure having the gate region, impurity diffusion regions, barrier metal layer, and passivation layer;
    forming contact holes in the interlayer insulating layer to expose portions of the gate region and impurity diffusion regions; and
    forming contact plugs in the contact holes.

2. The method of claim 1, wherein the barrier metal is a silicide layer comprising titanium (Ti), molybdenum (Mo), tungsten (W), cobalt (Co), and/or nickel (Ni).

3. The method of claim 1, wherein forming the passivation layer comprises performing a plasma process on the semiconductor substrate using a mixing gas comprising Ar/H2 or Ar/D2.

4. The method according to claim 1, wherein performing the nitridation process comprises performing the nitridation process using plasma comprising NH3 or N2/H2.

5. The method of claim 1, wherein forming the barrier metal layer comprises:
    supplying a process gas for forming the barrier metal layer into a process chamber; and
    dissolving the process gas using a plasma energy so as to form the barrier metal layer on the gate region and the impurity diffusion regions of the semiconductor substrate.

6. The method of claim 5, wherein supplying the process gas comprises:
    bypassing an exhaust line through a gas flow control unit to stabilize the process gas; and
    pre-flowing the process gas to be diffused into the process chamber.

7. The method of claim 5, wherein the process gas comprises titanium tetrachloride (TiCl4).

8. The method of claim 5, wherein the plasma energy used to dissolve the process gas is plasma energy formed by a gas comprising Ar and H2.

9. A method of forming a semiconductor device, comprising:
    forming a gate region, comprising a gate oxide layer, and impurity diffusion regions on a semiconductor substrate;
    forming a barrier metal layer comprising a silicide layer to serve as a contact resistance on the gate region and impurity diffusion regions of the semiconductor substrate;
    performing a plasma process, comprising Ar/H2 or Ar/D2, on the semiconductor substrate having the silicide layer formed thereon, thereby forming a H2 or D2 passivation layer at an interface between the semiconductor substrate and the gate oxide layer; then
    performing a nitridation process using NH3 or N2/H2 plasma to remove impurities from the semiconductor substrate;
    forming an interlayer insulating layer on the resultant structure having the gate region, impurity diffusion regions, barrier metal layer, and passivation layer;
    forming contact holes in the interlayer insulating layer to expose portions of the gate region and impurity diffusion regions; and
    forming contact plugs in the contact holes.

10. The method of claim 9, wherein the silicide layer comprises titanium (Ti), molybdenum (Mo), tungsten (W), cobalt (Co), and/or nickel (Ni).

11. The method of claim 9, wherein forming the barrier metal layer comprises:
    supplying a process gas for forming the barrier metal layer into a process chamber; and
    dissolving the process gas using a plasma energy so as to form the barrier metal layer on the gate region and the impurity diffusion regions of the semiconductor substrate.

12. The method of claim 11, wherein supplying the process gas comprises:
    bypassing an exhaust line through a gas flow control unit to stabilize the process gas; and
    pre-flowing the process gas to be diffused into the process chamber.

13. The method of claim 11, wherein the process gas comprises titanium tetrachloride (TiCl4).

14. The method of claim 11, wherein the plasma energy used to dissolve the process gas is plasma energy formed by a gas comprising Ar and H2.

15. A method of forming a semiconductor device, comprising:
    supplying TiCl4, Ar, and H2 gas into a process chamber holding a semiconductor substrate, the semiconductor substrate having a gate region, comprising a gate oxide layer, and impurity diffusion regions formed thereon;
    forming plasma using the Ar and H2 gas;
    dissolving the TiCl4 gas using Ar and H2 plasma energy, thereby forming a TiSi2 layer on the gate region and the impurity diffusion regions of the semiconductor substrate;
    performing a plasma process using Ar/H2 or Ar/D2 on the semiconductor substrate having the TiSi2 layer formed thereon, thereby forming a H2 or D2 passivation layer at an interface between the semiconductor substrate and the gate oxide layer; then performing a nitridation process using NH3 or N2/H2 plasma to remove Cl dissolved from the TiCl4 gas and/or existing in the semiconductor substrate;

forming an interlayer insulating layer on the resultant structure having the gate region, impurity diffusion regions, and passivation layer;

forming contact holes in the interlayer insulating layer to expose portions of the gate region and impurity diffusion regions; and forming contact plugs in the contact holes.

16. A method of forming a semiconductor device, comprising:

forming a gate region, comprising a gate oxide layer, and impurity diffusion regions on a semiconductor substrate;

forming a barrier metal layer on the gate region and the impurity diffusion regions of the semiconductor substrate;

performing a nitridation process to remove impurities from the semiconductor substrate; then forming a passivation layer at an interface between the semiconductor substrate and the gate oxide layer to remove defects of the gate oxide layer;

forming an interlayer insulating layer on the resultant structure having the gate region, impurity diffusion regions, barrier metal layer, and passivation layer;

forming contact holes in the interlayer insulating layer to expose portions of the gate region and impurity diffusion regions; and forming contact plugs in the contact holes.

17. The method of claim 16, wherein the barrier layer metal comprises titanium (Ti), molybdenum (Mo), tungsten (W), cobalt (Co), and/or nickel (Ni).

18. The method of claim 16, wherein forming the passivation layer comprises performing a plasma process on the semiconductor substrate using a mixing gas comprising Ar/H2 or Ar/D2.

19. The method of claim 16, wherein performing the nitridation process comprises performing the nitridation process using plasma comprising NH3 or N2/H2.

20. The method of claim 16, wherein forming the barrier metal layer comprises:

supplying a process gas for forming the barrier metal layer into a process chamber; and dissolving the process gas using a plasma energy so as to form the barrier metal layer on the gate region and the impurity diffusion regions of the semiconductor substrate.

21. The method of claim 20, wherein supplying the process gas comprises:

bypassing an exhaust line through a gas flow control unit to stabilize the process gas; and pre-flowing the process gas to be diffused into the process chamber.

22. The method of claim 20, wherein the process gas comprises titanium tetrachloride (TiCl4).

23. The method of claim 20, wherein the plasma energy used to dissolve the process gas is plasma energy formed by a gas comprising Ar and H2.

24. A method of forming a semiconductor device, comprising:

forming a gate region, comprising a gate oxide layer, and impurity diffusion regions on a semiconductor substrate;

forming a barrier metal layer comprising a silicide layer to serve as a contact resistance on the gate region and impurity diffusion regions of the semiconductor substrate;

performing a nitridation process using NH3 or N2/H2 plasma to remove impurities from the semiconductor substrate; then performing a plasma process, comprising Ar/H2 or Ar/D2, on the semiconductor substrate having the silicide layer formed thereon, thereby forming a H2 or D2 passivation layer at an interface between the semiconductor substrate and the gate oxide layer;

forming an interlayer insulating layer on the resultant structure having the gate region, impurity diffusion regions, barrier metal layer, and passivation layer;

forming contact holes in the interlayer insulating layer to expose portions of the gate region and impurity diffusion regions; and forming contact plugs in the contact holes.

25. The method of claim 24, wherein the silicide layer comprises titanium (Ti), molybdenum (Mo), tungsten (W), cobalt (Co), and/or nickel (Ni).

26. The method of claim 24, wherein forming the barrier metal layer comprises:

supplying a process gas for forming the barrier metal layer into a process chamber; and dissolving the process gas using a plasma energy so as to form the barrier metal layer on the gate region and the impurity diffusion regions of the semiconductor substrate.

27. The method of claim 26, wherein supplying the process gas comprises:

bypassing an exhaust line through a gas flow control unit to stabilize the process gas; and pre-flowing the process gas to be diffused into the process chamber.

28. The method of claim 26, wherein the process gas comprises titanium tetrachloride (TiCl4).

29. The method of claim 26, wherein the plasma energy used to dissolve the process gas is plasma energy formed by a gas comprising Ar and H2.

30. A method of forming a semiconductor device, comprising:

supplying TiCl4, Ar, and H2 gas into a process chamber holding a semiconductor substrate, the semiconductor substrate having a gate region, comprising a gate oxide layer, and impurity diffusion regions formed thereon;

forming plasma using the Ar and H2 gas;

dissolving the TiCl4 gas using Ar and H2 plasma energy, thereby forming a TiSi2 layer on the gate region and the impurity diffusion regions of the semiconductor substrate;

performing a nitridation process using NH3 or N2/H2 plasma to remove Cl dissolved from the TiCl4 gas and/or existing in the semiconductor substrate; then performing a plasma process using Ar/H2 or Ar/D2 on the semiconductor substrate having the TiSi2 layer formed thereon, thereby forming a H2 or D2 passivation layer at an interface between the semiconductor substrate and the gate oxide layer;

forming an interlayer insulating layer on the resultant structure having the gate region, impurity diffusion regions, and passivation layer;

forming contact holes in the interlayer insulating layer to expose portions of the gate region and impurity diffusion regions; and forming contact plugs in the contact holes.

* * * * *